(12) United States Patent
Marr

(10) Patent No.: US 6,584,030 B2
(45) Date of Patent: Jun. 24, 2003

(54) MEMORY CIRCUIT REGULATION SYSTEM AND METHOD

(75) Inventor: Kenneth W. Marr, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/941,130

(22) Filed: Aug. 28, 2001

(65) Prior Publication Data

US 2003/0043677 A1 Mar. 6, 2003

(51) Int. Cl.[7] .............................................. G11C 7/00
(52) U.S. Cl. ................... 365/226; 365/226; 365/189.09; 365/189.11
(58) Field of Search .................... 365/189.09, 226, 365/189.01, 154, 189.11; 326/30; 327/538

(56) References Cited

U.S. PATENT DOCUMENTS

| | | | |
|---|---|---|---|
| 5,475,633 A | * 12/1995 | Mehalel | 365/154 |
| 5,745,414 A | 4/1998 | Engh et al. | 365/185.2 |
| 5,844,853 A | * 12/1998 | Kitsukawa et al. | 365/189.09 |
| 6,055,186 A | 4/2000 | Hung et al. | 365/185.18 |
| 6,087,893 A | 7/2000 | Oowaki et al. | 327/537 |
| 6,147,511 A | 11/2000 | Patel et al. | 326/81 |
| 6,177,807 B1 | * 1/2001 | Bertin et al. | 326/26 |
| 6,232,827 B1 | 5/2001 | De et al. | 327/537 |
| 6,268,763 B1 | * 7/2001 | Fujikawa | 327/52 |
| 6,285,242 B1 | 9/2001 | Hardee | 327/536 |
| 6,366,156 B1 | 4/2002 | Narendra et al. | 327/534 |

* cited by examiner

Primary Examiner—David Lam
(74) Attorney, Agent, or Firm—Schwegman, Lundberg, Woessner & Kluth, P.A.

(57) ABSTRACT

Systems and methods are provided for regulating a memory circuit. The memory circuit regulation system includes an array regulator adapted for distributing an array supply voltage to a memory cell array, and at least one periphery regulator adapted for distributing at least one periphery supply voltage to at least one periphery circuit. In one embodiment, the array supply voltage is higher than the at least one periphery supply voltage to account for the fundamental lower limit of voltage operation for the LL4TCMOS SRAM cells. The higher array supply voltage provides appropriate stability margins for the SRAM cells so as to discourage or prevent accidental writes to the cells. In another embodiment, the array regulator sources a temperature-dependent current to provide an offset to the temperature-dependent subthreshold leakage current in the plurality of LL4TCMOS SRAM cells.

52 Claims, 11 Drawing Sheets

BAD CELL (HIGH $V_{TN}$)

$I_2$ (JUNCTION LEAKAGE)

$I_1$ (TRANSISTOR LEAKAGE)

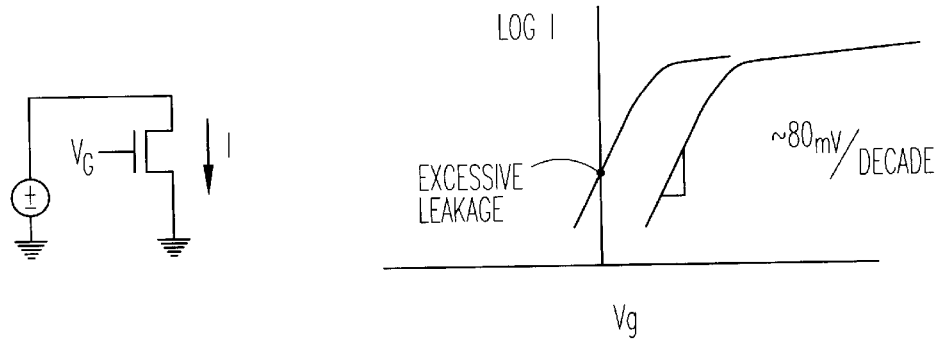
*Fig.13A*
*Fig.13B*
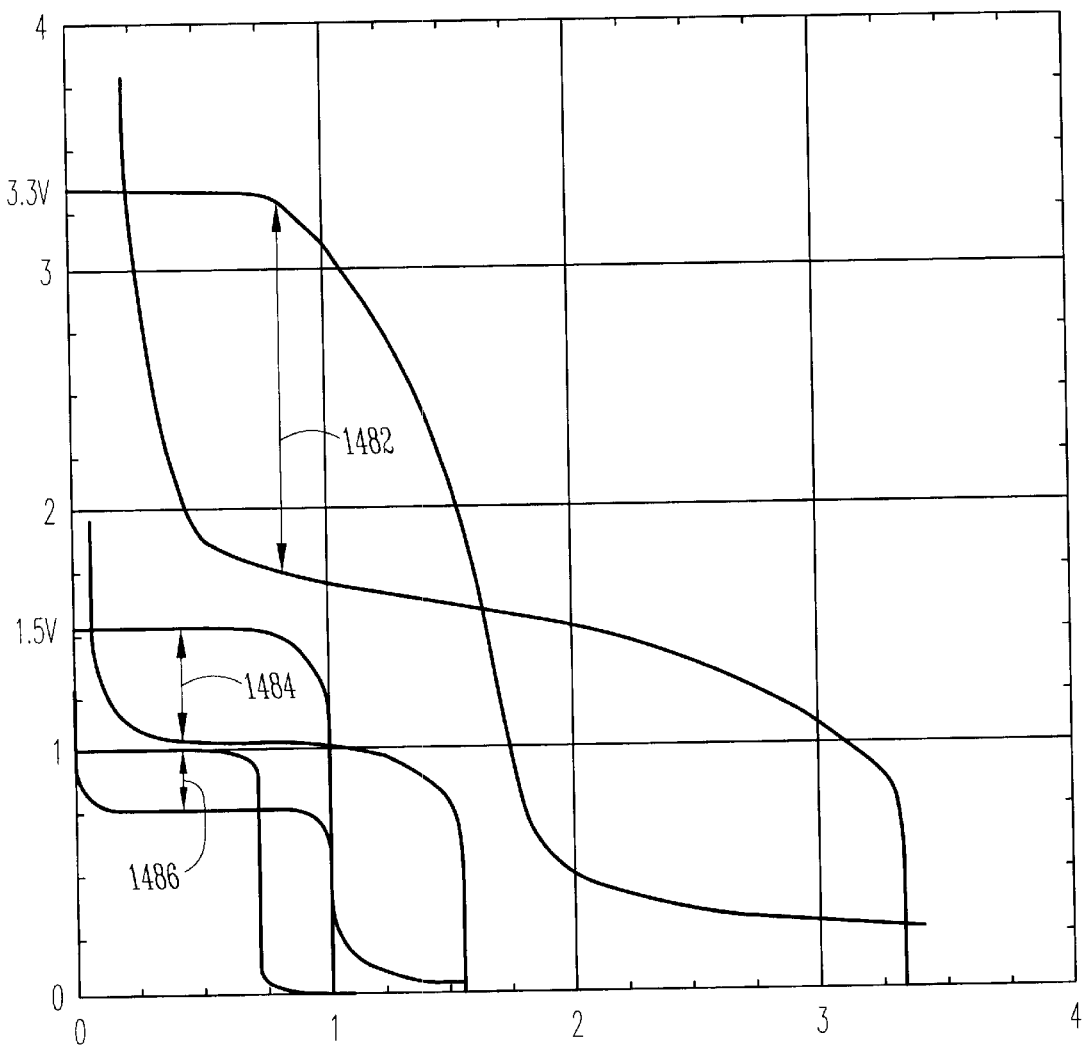
*Fig.14*

MEMORY CIRCUIT REGULATION SYSTEM AND METHOD

TECHNICAL FIELD OF THE INVENTION

This invention relates generally to Static Random Access Memory (SRAM) devices and, more particularly, to SRAM devices that utilize a loadless four transistor design.

BACKGROUND OF THE INVENTION

Manufacturers are designing smaller and more power efficient integrated circuits by improving CMOS processes and reducing device dimensions. Scaling is the process of modeling the changes in electrical behavior that result from reducing the device dimensions. In constant field scaling, for example, the voltage is scaled down as the device dimensions are reduced. Maintaining proper circuit operation by maintaining the appropriate stability margin is a design concern as the voltage is decreased. Many of these integrated circuits include arrays of SRAM cells. Failure to maintain the appropriate stability margin in a SRAM cell may result in a failure to retain data in the cell, a change in the data state of the cell while reading, or in an accidental write to the cell.

SRAM cell designs have progressed from a four transistor SRAM cell illustrated in FIG. 1 and a six transistor SRAM cell illustrated in FIG. 2 to a loadless four transistor SRAM cell illustrated in FIG. 3. The four transistor SRAM cell or NMOS resistor load cell, hereinafter referred to as the 4-T SRAM cell, occupies a relatively small area, but the fabrication of the passive loads involves relatively complex steps. Additionally, the 4-T SRAM cell can inadvertently become monostable or read unstable rather than maintaining its bistable characteristics. This stability problem has caused the 4-T SRAM to lose favor in SRAM cell design during the past few years. The six transistor SRAM cell, hereinafter referred to as the 6-T SRAM cell, is relatively stable and is able to operate at lower supply voltages than the 4-T SRAM. However, the 6-T SRAM cell is approximately 30% to 40% larger than the 4-T SRAM cell, and thus more expensive.

The problems associated with the 4-T SRAM cell and the 6-T SRAM cell have led to the development of the loadless four transistor SRAM cell, hereinafter referred to as the LL4TCMOS SRAM cell. The LL4TCMOS SRAM cell comprises a pair of NMOS pull-down transistors and a pair of PMOS access transistors. The LL4TCMOS SRAM is relatively small, although it is not as small as the 4-T SRAM cell as it incorporates CMOS devices. However, the LL4TCMOS SRAM cell design suffers from data retention and unintentional write problems such as failures attributable to the effects of leakage current and to the effects of noise.

Due to the intrinsic operation of SRAM cells, there is a fundamental lower limit of voltage operation for the LL4TCMOS SRAM array that is higher than the fundamental lower limit of voltage operation for periphery logic devices in the memory circuit. For example, as process scaling occurs, the periphery may be able to operate from about 0.7V to 1.2V while maintaining appropriate stability margins. However, the LL4TCMOS SRAM array may need to operate at a higher voltage than the periphery circuits, and thus may need to operate at about 1.0V to 1.5V to maintain the appropriate stability margins over the $V_{TN}$. Additionally, the LL4TCMOS SRAM array is sensitive to $V_{CC}$ noise at lower voltages because of the reduced write margin which is approximately the $V_{CC}$ of the array less the $V_{TN}$ ($V_{CC(ARRAY)} - V_{TN}$).

Therefore, there is a need in the art to provide a system and method that overcomes these problems.

SUMMARY OF THE INVENTION

The above mentioned problems are addressed by the present subject matter and will be understood by reading and studying the following specification. The present subject matter provides a regulation system and method for a memory circuit, particularly an LL4TCMOS SRAM array.

One aspect of the present invention is a memory regulation system that includes at least two distinct regulators. At least one periphery regulator provides at least one periphery voltage for the periphery of the memory circuit, and a separate array regulator provides the array voltage for the memory array of the memory circuit. The array regulator is connected to the bit lines and to a reference generator. The separate array regulator allows the regulated voltage of the array to be operated at a higher voltage than the regulated voltage for the periphery circuits. The bias reference voltage causes subthreshold current to be sourced from the complementary digit lines or bit lines and through the access transistors to offset leakage current in the LL4TCMOS SRAM cells that, if not offset, could cause the cell to fail. Additionally, the separate array regulator provides a clean power supply to the LL4TCMOS SRAM array which is particularly sensitive to noise because of the approximately 80 mV per decade subthreshold current response of the p-channel access transistors which are also the load elements. As such, the separate array regulator is beneficial even if the array regulator and the periphery regulator(s) provide the same regulated voltage. Thus, the separate array regulator provides a stable bias reference voltage.

These and other aspects, embodiments, advantages, and features will become apparent from the following description of the invention and the referenced drawings.

BRIEF DESCRIPTION OF THE DRAWINGS

FIG. 10 illustrates a half latch of a LL4TCMOS SRAM cell in which data is being written to or read from.

FIG. 13A illustrates a pull-down transistor in a LL4TCMOS SRAM cell.

FIG. 13B illustrates the relationship between the log of the subthreshold current I and the gate voltage $V_G$ for the circuit of FIG. 13A.

FIG. 14 illustrates stability margins, and particularly write noise margins for a SRAM cell at 3.3 volts, 1.5 volts and 1.0 volts.

DETAILED DESCRIPTION OF THE INVENTION

Figure 1:
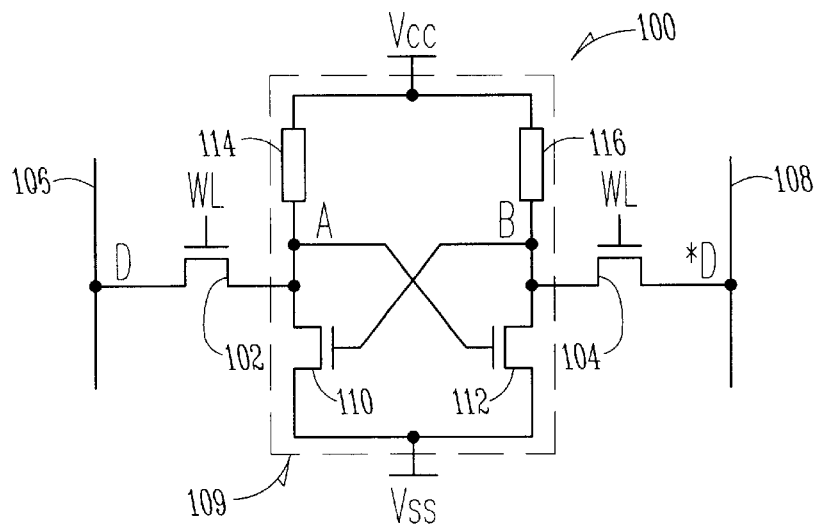
FIG. 1 is a circuit diagram of a 4-T SRAM cell.

The following detailed description of the invention refers to the accompanying drawings which show, by way of illustration, specific aspects and embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims, along with the full scope of equivalents to which such claims are entitled.

The present subject matter regulates memory circuits. According to the present invention, at least one periphery regulator provides at least one periphery voltage for the periphery of the memory circuit, and a separate array regulator provides the array voltage for the memory array of the memory circuit. The separate array regulator provides a clean supply to the noise-sensitive LL4TCMOS SRAM array. One embodiment of the present invention provides a regulated voltage for the array that is higher than the regulated voltage for the periphery circuit.

Figure 2:
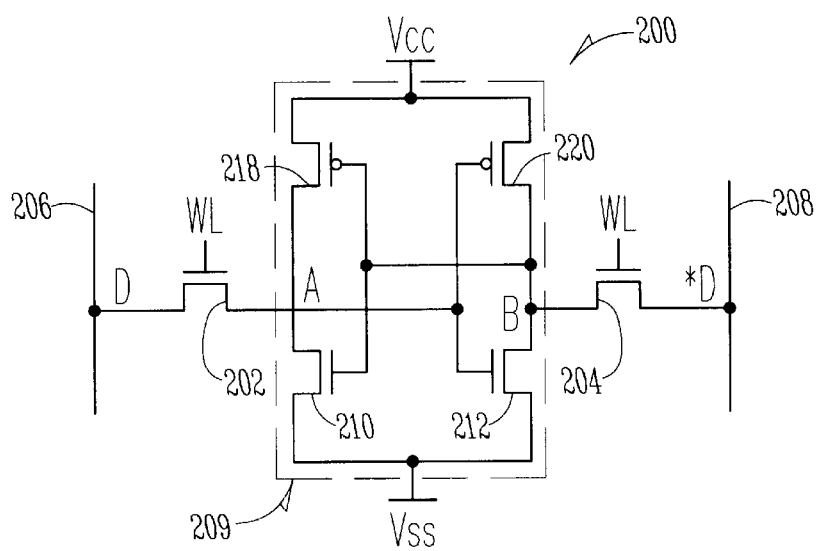
FIG. 2 is a circuit diagram of a 6-T SRAM cell.
Figure 3:
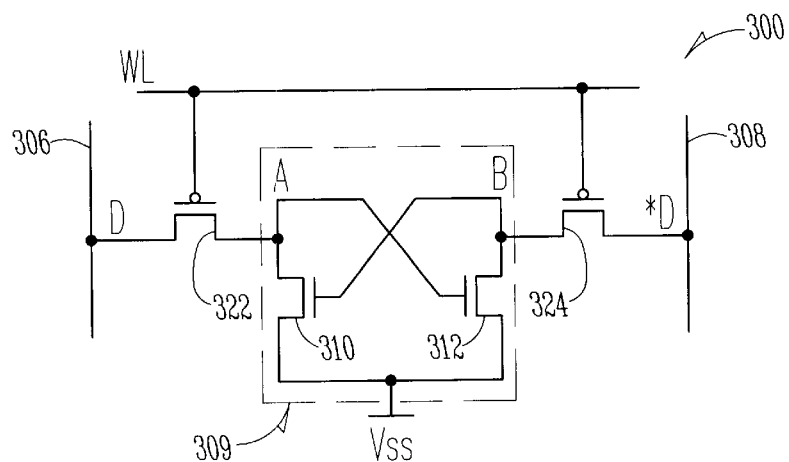
FIG. 3 is a circuit diagram of a LL4TCMOS SRAM cell.

FIGS. 1, 2 and 3 illustrate the progression of SRAM cell design from a 4-T SRAM cell and 6-T SRAM cell to the LL4TCMOS SRAM cell. Each of these cell designs have problems or potential problems. FIG. 1 is a circuit diagram of a conventional 4-T SRAM cell 100. A pair of NMOS access transistors 102 and 104 allow complementary bit values D and *D on the digit lines 106 and 108 to be read from and to be written to a storage circuit 109 of the cell 100. The storage circuit 109 includes NMOS pull-down transistors 110 and 112. Nodes A and B are the complementary inputs/outputs of the storage circuit 109, and the respective complementary logic values at these nodes represent the state of the cell. For example, when the node A is at logic 1 and the node B is at logic 0, then the cell is storing a logic 1. Conversely, when the node A is at logic 0 and the node B is at logic 1, then the cell is storing a logic 0. The cell 100 is bistable as it can have one of two stable states, i.e. logic 1 or logic 0.

During a read of the cell, a word line WL, which is coupled to the gates of the access transistors 102 and 104, is driven to a voltage approximately equal to $V_{CC}$ to activate the transistors. For example, assume that $V_{CC}$=logic 1=2.5V and $V_{SS}$=logic 0=0V, and that at the beginning of the read, the cell 100 is storing a logic 0 such that the voltage level at the node A is 0V and the voltage level at the node B is 2.5V. As this is an example, it is noted that $V_{CC}$ may be scaled lower than 2.5V. The NMOS access transistor 102 couples the node A to the digit line 106, and the NMOS access transistor 104 couples the node B to the digit line 108. The digit lines 106 and 108 have a capacitance. Due to the high voltage at node B, the current flow from the node A to ground through NMOS pull-down transistor 110 pulls down the digit line 106. Digit line 108 is not pulled down because, due to the low voltage at node A, there is not a current flow from the node B to ground through NMOS pull-down transistor 112. The resulting bit line differential allows a sense amp to read the stored logic value of the cell.

During a write of a logic 1 to the cell 100, the access transistors 102 and 104 are activated as discussed above, and logic 1 is driven onto the digit line 106 and a logic 0 is driven onto the digit line 108. The transistor 102 couples 1.5V (the 2.5V on the digit line 106 minus the 1V threshold of the transistor 102) to the node A, and the transistor 104 couples 0V from the digit line 108 to the node B. The low voltage on the node B turns off the NMOS transistor 110. A write can occur within a time frame on the order of nanoseconds. The inactive NMOS transistor 110 allows node A to be pulled up by the access device 102 to $V_{CC}-V_T$, because the time constant of the passive load 114 is on the order of milliseconds, and thus is too long to contribute to the restoration of a high voltage. This high voltage on the node A turns on the NMOS transistor 112, and allows the NMOS transistor 112 to reinforce the logic 0 on the node B. Likewise, if the voltage written to the node B is 1.5V and the voltage written to the node A is 0V, the positive-feedback configuration ensures that the cell will store a logic 0.

The 4-T SRAM cell 100 includes conventional passive loads 114 and 116 that pull up the voltage at one of the nodes A or B if the associated NMOS pull-down transistor for that node is inactive. Polysilicon resistors form these passive loads 114 and 116 in one embodiment. The loads 114 and 116 are usually built in another level above the access transistors 102 and 104 and the NMOS pull-down transistors 110 and 112. Thus, the 4-T cell occupies a small area, which results in reduced cost. However, complex steps are required to form the load elements 114 and 116 such that the construction of the 4-T cells presents a complexity versus cost tradeoff. The resistive loads 114 and 116 do not play a significant role in determining read stability because, during a read, a low voltage at a node is probably large enough that, if the low voltage is applied to a gate of a cross-coupled transistor, the voltage can cause the cross-coupled transistor to operate, at least partially, in the subthreshold region. The threshold voltage of the access devices 102 and 104 hurts stability because, when a node is at a high voltage, a voltage drop attributable to the threshold voltage occurs. Therefore, the high voltage $V_H$ at node A or node B is characterized by the relation $V_H=V_{CC}-V_T$. Thus, under certain conditions as will be described in more detail below with respect to the stability margin curves of FIGS. 11A–11C, the 4-T SRAM cell 200 can inadvertently become monostable or read unstable instead of maintaining a desired bistable characteristic. Also, the 4-T SRAM cell 100 consumes a considerable amount of power because there is always current flowing from $V_{CC}$ to $V_{SS}$ either through the load 114 and the NMOS pull-down transistor 110 or through the load 116 and the NMOS pull-down transistor 112.

FIG. 2 is a circuit diagram of a conventional 6-T SRAM cell 200. Elements common to FIGS. 1 and 2 are referenced with like numbers. Rather than using passive pull-up loads 114 and 116 as does the 4-T SRAM cell 100 of FIG. 1, the 6-T SRAM cell 200 uses PMOS pull-up transistors 218 and 220 in conjunction with the NMOS pull-down transistors 210 and 212 to form the storage circuit 209. For example, during a write of a logic 1 to the 6-T SRAM cell 200, the transistors 202 and 204 are activated as discussed above, and a logic 1 is driven onto the digit line 206 and a logic 0 is driven onto the digit line 208. Thus, in an embodiment where $V_{CC}$=2.5V, the transistor 202 couples 1.5V (the 2.5V on the digit line 206 minus the 1V threshold of the transistor 202) to the node A, and the transistor 204 couples 0V from the digit line 208 to the node B. The low voltage on the node B turns off the NMOS pull-down transistor 210, and turns on the PMOS transistor 218. Thus the inactive NMOS transistor 210 allows the PMOS transistor 218 to pull the node A up to 2.5V. Additionally, the access transistor 202 assists with pulling the node A up to $V_{CC}$-$V_T$, i.e. 1.5V. This high voltage on the node A turns on the NMOS transistor 212 and turns off the PMOS transistor 220, thus allowing the NMOS transistor 212 to reinforce the logic 0 on the node B. Likewise, if the voltage written to the node B is 1.5V and that written to the node A is 0V, the positive-feedback configuration ensures that the 6-T SRAM cell 200 will store a logic 0.

Because the PMOS transistors 218 and 220 have low on resistances (typically on the order of a few kOhms), they can pull the respective nodes A and B virtually all the way up to $V_{CC}$, and thus render the 6-T SRAM cell 200 relatively stable and allow the cell 200 to operate at a lower supply voltage than the 4-T SRAM cell 100 of FIG. 1. The 6-T SRAM cell 200 is relatively stable because the high voltage $V_H$ is $V_{CC}$ rather than $V_{CC}$-$V_T$ as is the case for the 4-T SRAM cell. The power consumption is rather low for the 6-T SRAM cell 200 as, in contrast to the 4-T SRAM cell 100, the current flow from $V_{CC}$ to $V_{SS}$ in the 6-T SRAM cell 200 is always blocked by one of the NMOS/PMOS pairs. However, the six transistor CMOS design causes the 6-T SRAM cell 200 to be approximately 30% to 40% larger than the NMOS design of the 4-T SRAM cell 100, and thus more expensive.

The problems associated with the 4-T SRAM cell 100 and the 6-T SRAM cell 200 have led to the development of the LL4TCMOS SRAM cell. FIG. 3 is a circuit diagram of a conventional LL4TCMOS SRAM cell 300, where elements common to FIGS. 1, 2 and 3 are referenced with like numerals. A difference between the LL4TCMOS SRAM cell 300 of FIG. 3 and the 4-T SRAM cell 100 of FIG. 1 is the elimination of the load elements 114 and 116 and the replacement of NMOS access transistors 102 and 104 with PMOS access transistors 322 and 324. The LL4TCMOS SRAM cell 300 is relatively small, but is larger than the 4-T SRAM cell 100 as it incorporates CMOS devices.

However, as provided below, the conventional LL4TCMOS SRAM cell design suffers from stability margin (write noise margin) problems under low voltage operation. The relationship between the size of the access transistors 322 and 324 and the size of the pull-down transistors 310 and 312 is a factor in SRAM cell design, and is referred to as the Beta ratio. The Beta ratio is the ratio of the Beta for the PMOS access transistors 322 and 324 and the NMOS pull-down transistors 310 and 312. The Beta ratio implies an impedance ratio that affects the available voltage at nodes A and B, and thus the margins of failure for the cell 300. A data retention failure can occur because of the effect of leakage currents in the SRAM cell and the effect of noise.

Leakage currents are generated by the NMOS pull-down transistors 310 and 312. These currents can include off-state subthreshold device leakage as well as reverse-biased junction leakages. One of the two transistors 310 or 312 always will be inactive as they are cross-coupled to form the storage circuit 309. The cell 300 may flip states if there is more leakage current out of the node than is being supplied to the node by the load element. In order to prevent the LL4TCMOS SRAM cell 300 from losing too much charge at one of the nodes A or B and from spontaneously changing state as a result, the PMOS access transistors 322 and 324 must source sufficient current from the digit lines 306 and 308 to offset the leakage currents. The required offset current can vary over several orders of magnitude due to temperature and process variations. The parasitic device leakage current may rise approximately 1.3 mV per degree C, for example. If the NMOS pull-down transistors 310 and 312 have a high threshold voltage $V_{TN}$ to minimize leakage current, the SRAM cell 300 may lose its stability margin, i.e. the write noise margin. If the transistors 310 and 312 have a low threshold voltage $V_{TN}$, the leakage current is too large at hot temperatures, which may result in data retention failures.

Wide temperature variations resulting from cold-data retention testing and burn-in testing cause wide variations in leakage and subthreshold currents. Such testing, coupled with normal process variations, sense amp margin requirements, and yield requirements such as read/write stability requirements and power consumption requirements, have made the manufacturing of LL4TCMOS SRAM devices a difficult matter.

Figure 4:
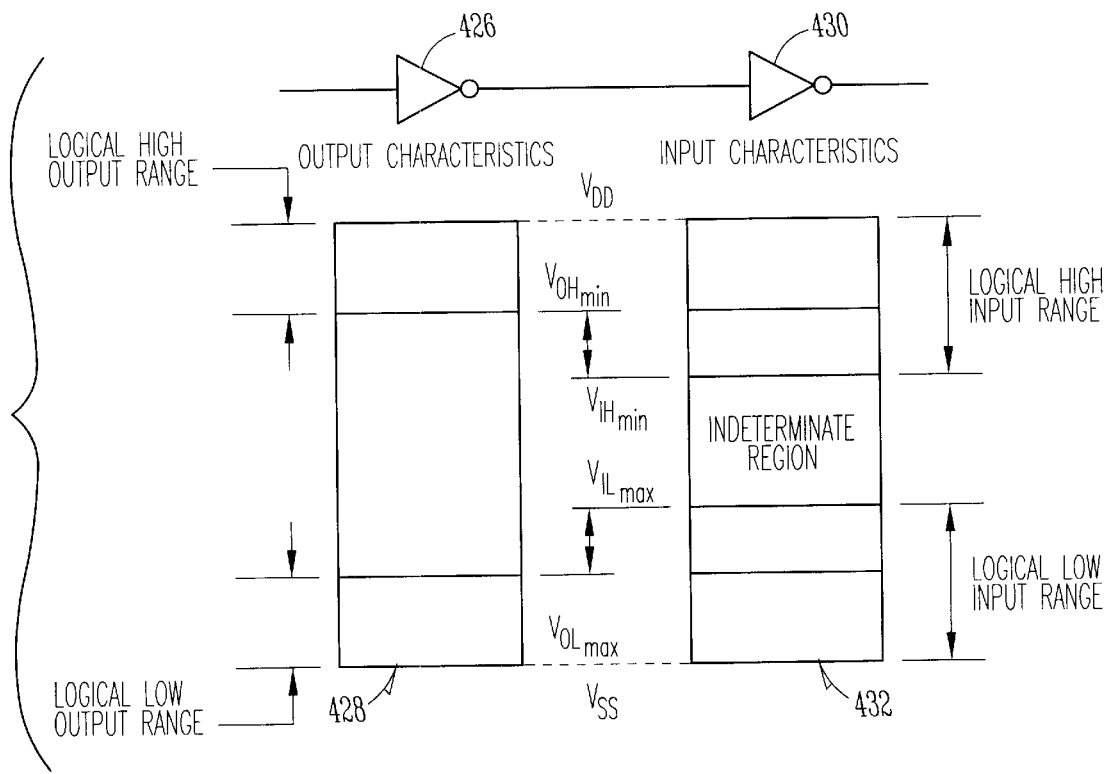
FIG. 4 illustrates signal noise margin for the purpose of developing the static noise margin (SNM) concept.
Figure 6:
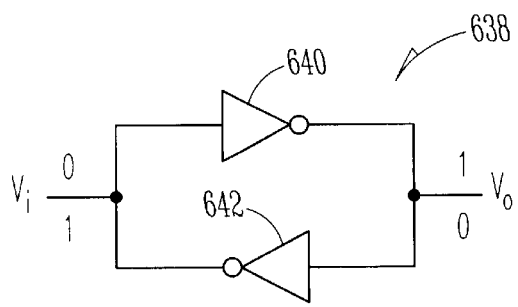
FIG. 6 illustrates a latch that comprises two inverters.
Figure 9:
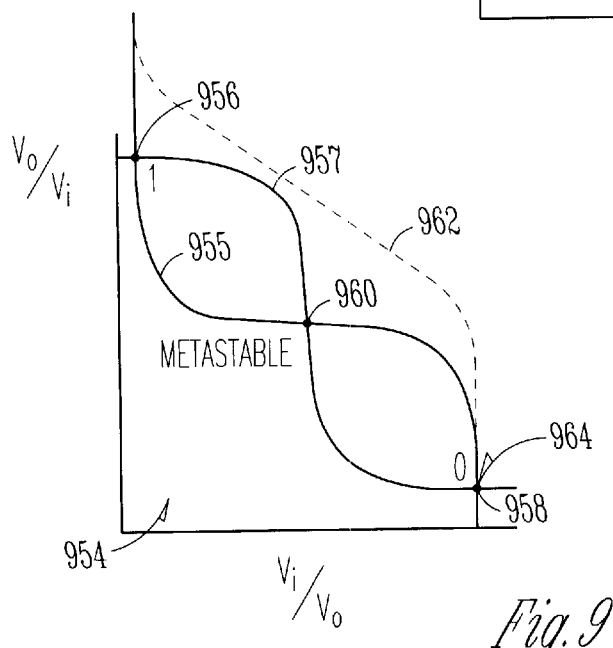
FIG. 9 illustrates a stability margin and provides a dotted line to illustrate a stability failure that results in a monostable circuit.

FIG. 4 illustrates signal noise margin for a simple driving gate and receiving gate, after which the signal noise margin concept will be developed into the stability margin concept for latches or memory cells in connection with FIGS. 6 and 9. Noise margin indicates the allowable noise voltage at an input that will not affect the output. A first or driving gate 426 provides output characteristics 428 and a second or receiving gate 430 provides input characteristics 432. A low noise margin $NM_L$, is defined as the difference in magnitude between the maximum low output voltage $V_{OLmax}$ of the driving gate 426 and the maximum input low voltage $V_{ILmax}$ recognized by the receiving gate 430. A high noise margin $NM_H$ is defined as the difference in magnitude between the minimum high output voltage $V_{OHmin}$ of the driving gate 426 and the minimum input high voltage $V_{IHmin}$ recognized by the receiving gate 430. Larger noise margins $NM_L$ and $NM_H$ result in a more stable circuit that is resistant to noise.

Figure 5:
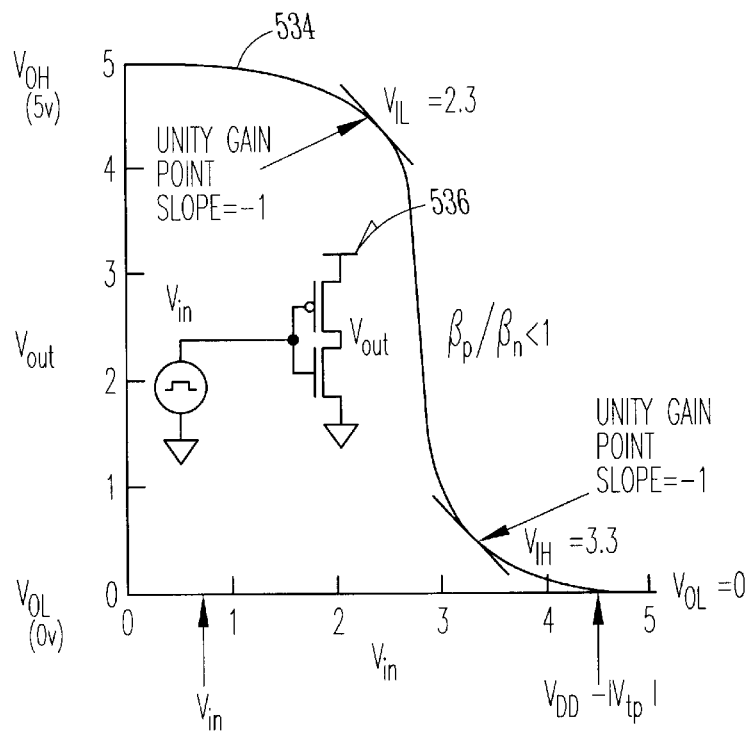
FIG. 5 illustrates transfer characteristics for a CMOS inverter.

FIG. 5 illustrates, for the purposes of example only, the transfer characteristic 534 for a typical CMOS inverter 536, and provides corresponding references to the voltage levels: $V_{OLmax}$, $V_{ILmax}$, $V_{OHmin}$, and $V_{IHmin}$. As the input of the inverter 536 is swept from a low voltage to a high voltage, the output of the inverter 536 makes a transition from a high voltage to low voltage as shown by the transfer curve. As will be developed in FIGS. 6–9, the transfer curve of the inverter forms a building block of the stability margin of a latch or memory circuit.

Figure 7:
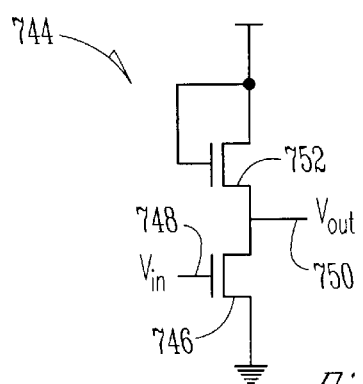
FIG. 7 illustrates a transistor circuit for a half latch, i.e. one of the inverters in the latch of FIG. 6.
Figure 8:
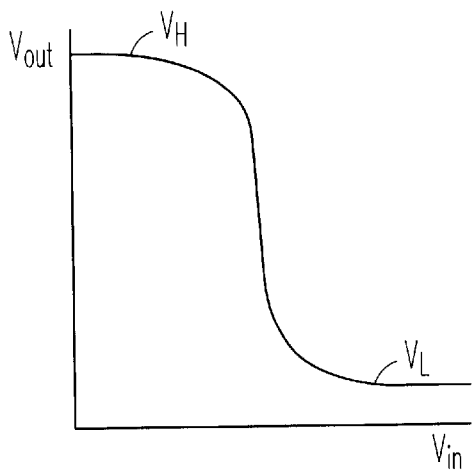
FIG. 8 illustrates a transfer characteristic for the circuit of FIG. 7.

FIG. 6 illustrates conventional logic circuitry for a latch 638 comprised of two complementary inverters 640 and 642. FIG. 7 illustrates a transistor circuit 744 for one of the inverters 640 or 642 in the conventional latch 638, or in other words, for a half-latch. The circuit 744 comprises a first NMOS transistor 746 with a gate connected to an input line 748, a drain connected to an output line 750, and a source connected to a ground or substrate voltage. The circuit further comprises a second diode-connected NMOS transistor 752 with a source connected to the output line 750, a drain connected to $V_{CC}$, and a gate connected to the drain. FIG. 8 illustrates a transfer characteristic for the half-latch circuit of FIG. 7. The transfer characteristic for the half latch circuit 744 of FIG. 7 is similar to the transfer characteristic for the CMOS inverter 536 of FIG. 5. As the input is swept from a low input logic value to a high input logic value, the output moves from the high output logic value to the low output logic value.

The latch 638 of FIG. 6, similar to the storage circuits 109, 209, and 309 of FIGS. 1, 2 and 3 respectively, comprises a pair of cross-coupled inverters 640 and 642 that provide positive feedback such that the circuit 638 is not easily analyzed with normal circuit analysis. Rather, referring to both FIG. 6 and FIG. 9, such a circuit 638 is analyzed graphically using stability curves 954 to describe the margin of failure. Margin of failure is a general term used to describe the stability of a circuit, and includes concepts such as signal noise margin with respect to logic circuits, and static and write noise margin for memory cells. Signal noise margin is applicable to any logic circuitry such as periphery circuits. Static noise margin is a term used in conjunction with reading a memory cell or latch. Write noise margin is a term used in conjunction with writing to a memory cell or latch since data is being written and stored in the cell. The stability curves 954 comprise two curves 955 and 957 that represent the transfer characteristic for each of the inverters 640 and 642 that comprise the latch 638, i.e. the transfer characteristic for that latch 638 as viewed from both sides of the latch 638. The solid stability lines 955 and 957 show a bistable latch, i.e. a circuit with two stable points such that a logic value at one node will reinforce the logic value at another logic node. The stable points 956 and 958 are identified at the points where the transfer curves 955 and 957 intersect. FIG. 9 also indicates that there is a third intersection near the midpoint of the transfer curves that provide metastable point 960. A dotted line 962 illustrates a stability failure that may incur due to a process variation in one of the inverters 640 or 642 such that they have different transfer characteristics. The dotted line 962 in this failure scenario intersects the second transfer curve 957 only in one place 964, and as such, is said to be monostable.

Figure 10:
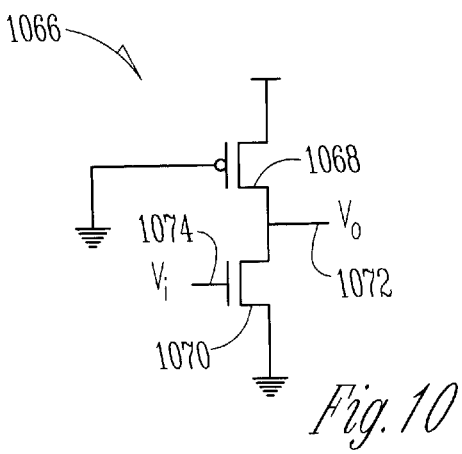

FIG. 10 illustrates a half latch circuit 1066 of a LL4TCMOS SRAM cell 300, shown in FIG. 3, to which data is being written to or from which data is being read. The circuit 1066 comprises an active PMOS access transistor 1068 and an NMOS pull-down transistor 1070. The circuit 1066 forms an inverter, as the logic value on the output line 1072 is the inverted logic of the logic value on the input line 1074. As previously described, the SRAM cell can be viewed as two half latch circuits connected as cross-coupled inverters.

Figure 11A:
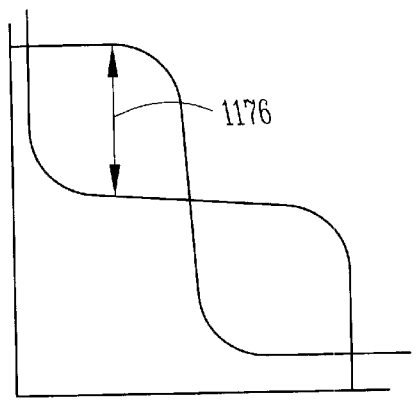
FIG. 11A illustrates a stability margin in the context of a write noise margin for the half latch of a SRAM cell as illustrated in FIG. 10, wherein the NMOS pull-down transistor has a low threshold voltage $V_{TN}$.
Figure 11B:
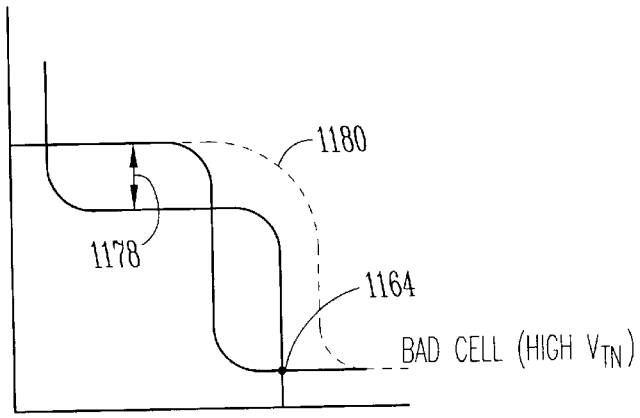
FIG. 11B illustrates a stability margin in the context of a write noise margin for the half latch of a SRAM cell as illustrated in FIG. 10, wherein the NMOS pull-down transistor has a high threshold voltage $V_{TN}$, and further illustrates by means of a dotted line a situation in which a SRAM cell becomes monostable, loses its write noise margin and fails.

FIGS. 11A and 11B illustrate stability margins, or write noise margins, for a SRAM cell as it relates to the pull-down voltage $V_{TN}$ for the half latch circuit 1066 of FIG. 10. An unacceptably low write noise margin can result in an unstable memory cell and an accidental write. As illustrated in FIG. 11A, if the NMOS pull-down transistor 1170 has a low threshold voltage $V_{TN}$, the SRAM cell has a large write noise margin 1176 and possesses the desirable characteristics of stability from accidental writes. However, as illustrated in FIG. 11B, if the NMOS pull-down transistor 1070 has a high threshold voltage $V_{TN}$, the SRAM cell has a lower write noise margin 1178 and possesses less stability from accidental writes. FIG. 11B also illustrates, by way of a dotted line, a situation in which the write noise margin 1180 is unacceptably low such as that which may occur if the threshold voltage $V_{TN}$ Of the NMOS pull-down transistor 1070 is too high. This may occur due to process variations. The stability curves 1154 for an unacceptably low write noise margin only intersect in one position 1164 and as such is monostable as mentioned above in connection with FIG. 9. A monostable cell, by definition, is a failure since only one logic state exists for the cell. However, as will be described with respect to FIGS. 12A and 12B, there are circumstances in which a larger threshold voltage $V_{TN}$ is desired to reduce leakage current.

Figure 12A:
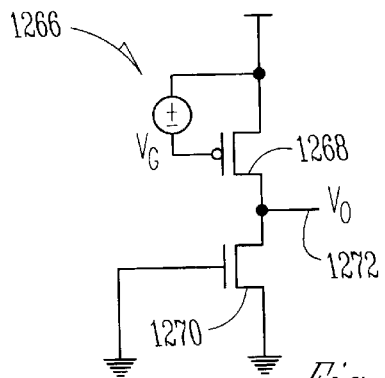
FIG. 12A illustrates a half latch of a LL4TCMOS SRAM cell in which data is being retained.
Figure 12B:
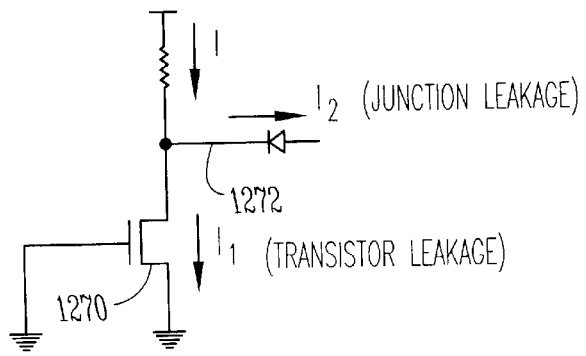
FIG. 12B illustrates the leakage paths for the half latch of FIG. 12A.

FIG. 12A illustrates a half latch 1266 in an LL4TCMOS SRAM cell in which data is being retained, and will be described in conjunction with FIG. 12B to illustrate leakage current. In the data retention state, the circuit 1266 comprises an inactive PMOS access transistor 1268 with its gate pulled high and an inactive NMOS pull-down transistor 1270 with its gate pulled low. A high logic voltage is stored on the output line 1272. FIG. 12B illustrates the leakage current paths for the half latch 1266 of FIG. 12A. The leakage current for the SRAM cell comprises two components. Referring to both FIGS. 3 and 12B, the first leakage current component $I_1$ is the subthreshold transistor leakage current through one of the NMOS pull-down transistors in the LL4TCMOS SRAM cell 300 such as transistor 310, for example. The second leakage current component $I_2$ is the reverse-biased junction leakage current from the drain node of one of the NMOS transistors such as transistor 310, for example. FIG. 12B also indicates the subthreshold current I that is required to be sourced through the PMOS access transistors 322 and 324 of FIG. 3 or 1268 of FIG. 12A of the LL4TCMOS SRAM cell to offset the leakage current $I_1$ and $I_2$, and prevent the SRAM cell 300 from changing state. The subthreshold leakage current I increases significantly as the temperature rises. For example, the subthreshold $V_T$ may increase 1.3 mV per degree C.

As illustrated by the logarithmic graph of FIG. 13, the relation between the gate voltage $V_G$ and the subthreshold current I that results can be approximately 80 mV per decade. The precise relationship is a function of process. The subthreshold $V_T$ is a function of temperature (1.3 mV per ° C.). If, for example, the temperature changes 61° C. (1.3 mV per ° C.*61° C.=80 mV), then the undesired leakage current I, increases by 10×, or a decade. This undesired leakage current provides data retention problems.

FIG. 14 illustrates static noise margins or write noise margins for a SRAM circuit at three voltage levels: 3.3V, 1.5V and 1.0V. FIG. 14 further illustrates that the write noise margin decreases as the voltage levels decrease. In the example shown, the write noise margin 1482 for the SRAM circuit at 3.3 volts is on the order of about 1.25V to 1.50V, the write noise margin 1484 for the SRAM circuit at 1.5V is on the order of about 0.40V to 0.50V, and the write noise margin 1486 for the SRAM circuit at 1V is on the order of 200 mV. It is evident that write noise margin becomes tighter and more of a concern as voltage scaling occurs. A SRAM circuit will have problems with accidental writes if it is operating at 1V with a write noise margin of 200 mV. When one of the bit lines of a SRAM array is driven low during a write to a SRAM cell, the voltage of an adjacent bit line will be induced lower to some degree due to capacitive coupling between the two adjacent lines. The coupling exists to some degree even if the bit lines are designed to reduce coupling by twisting bit lines, for example. If voltage on the second line couples down from 1.0V to about 0.8V, there will be an accidental write to the SRAM cell associated with the second or adjacent bit line. Maintaining an appropriate write noise margin for the SRAM array that accounts for the various noise sources is necessary to prevent these accidental writes caused by capacitive coupling in adjacent bit lines.

Figure 15:
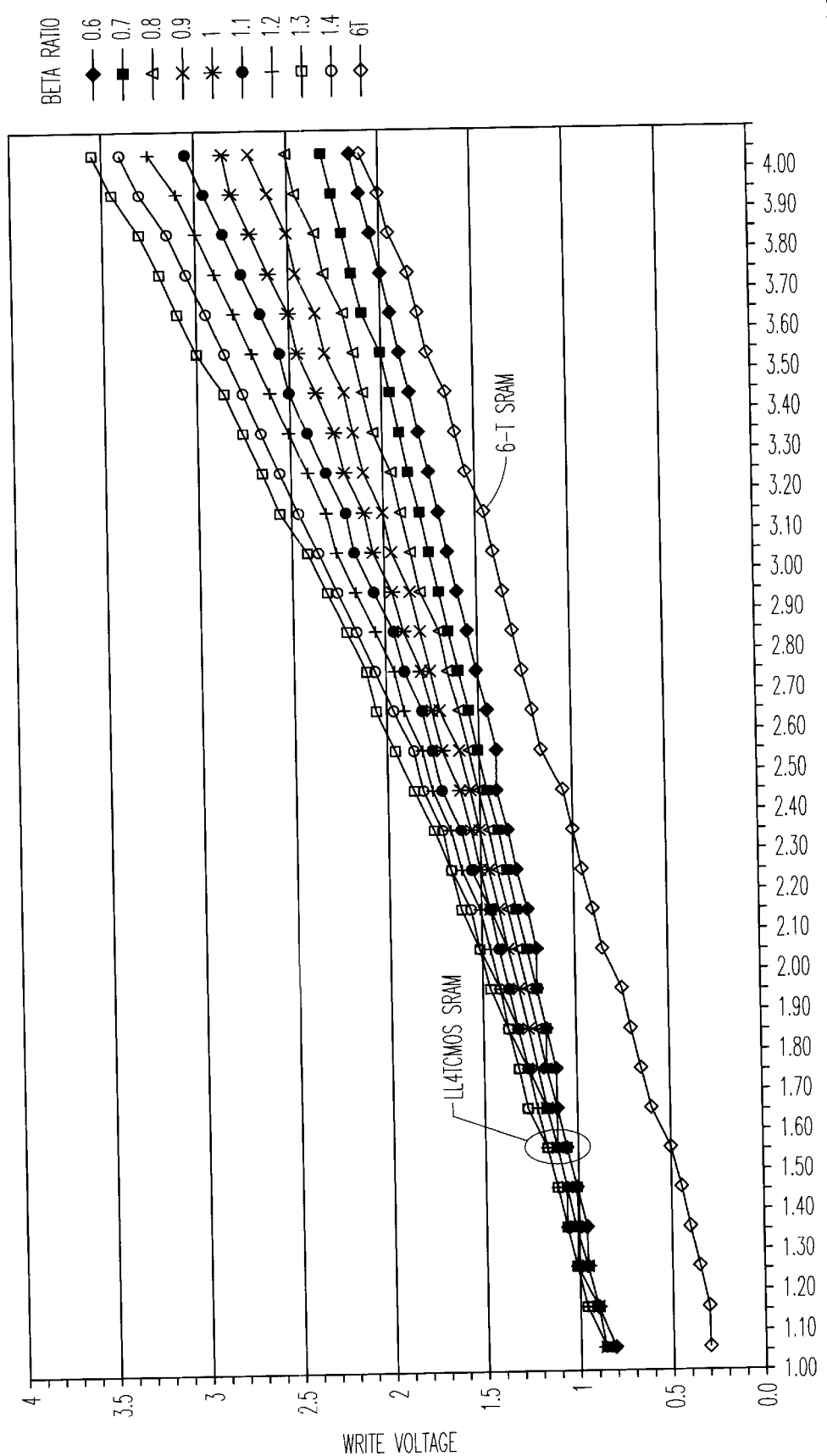
FIG. 15 is a graph of the write voltage plotted against $V_{CC}$ for both a 6-T SRAM cell and for LL4TCMOS SRAM cells of varying Beta ratios.

FIG. 15 is a graph of the write voltage plotted against the power $V_{CC}$ for both a 6-T SRAM cell 200 as illustrated in FIG. 2 and an LL4TCMOS SRAM cell 300 as illustrated in FIG. 3. Simulations were performed and plots were made for LL4TCMOS SRAM cells having different Beta ratios, which is the ratio of the Beta of the PMOS access transistor 322/324 to the Beta of the corresponding NMOS pull-down transistor 310/312. Again, the Beta ratio implies an impedance ratio for the PMOS access transistor 322/324 and the NMOS pull-down transistor 310/312 that controls the voltage drop across the PMOS access transistor 322/324, and thus the write voltage across the NMOS pull-down transistor 310/312. FIG. 15 shows that the LL4TCMOS SRAM cell 300 requires a larger write voltage than the 6-T SRAM cell 200 for the same $V_{CC}$. This difference in the required write voltage with respect to a $V_{CC}$ is attributable to the fundamental differences in operation between the two cell types.

Figure 16:
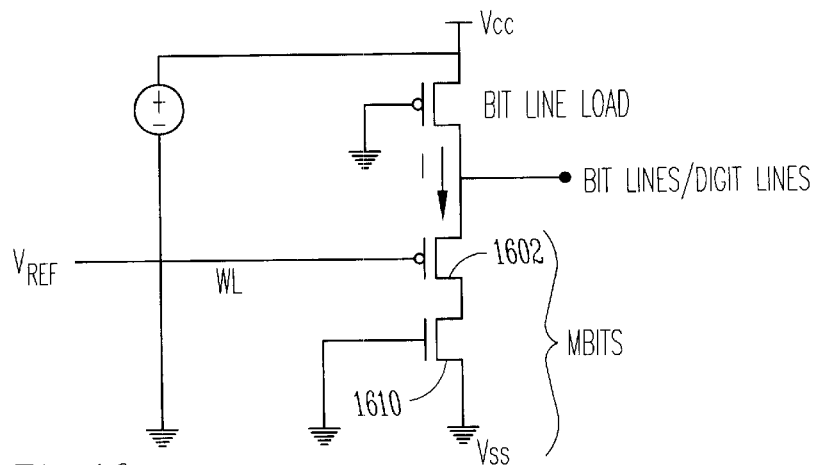
FIG. 16 illustrates a SRAM cell, wherein $V_{REF}$ is a capacitively decoupled stable supply voltage such as that which may be provided by a bias generator.

In order to solve these problems, the present invention provides a novel memory circuit regulation system and method as shown in FIGS. 16–21. FIG. 16 illustrates a SRAM cell. A bias generator provides $V_{REF}$, which is a capacitively decoupled stable supply. The SRAM cell illustration includes an active PMOS pull-up transistor (bit-line-load) connected between $V_{CC}$ and the bit line output, a PMOS access transistor 1602 whose gate is coupled to the $V_{REF}$ line, and an inactive NMOS pull-down transistor 1610 connected to $V_{SS}$. The PMOS transistor 1602 is operating in the subthreshold region, which, as illustrated in FIG. 13, has an exponential response of approximately 80 mV per decade. Assuming an 80 mV per decade response and a subthreshold current I of 50 pA per cell, for example, 160 mV of noise on the $V_{REF}$ line would result in 5 nA per cell of current. For a 32 Mbit device (225 bits) the change in current is approximately 170 mA. As one of ordinary skill in the art would know upon reading and understanding this disclosure, this is enough current to cause the circuit to malfunction.

Figure 17:
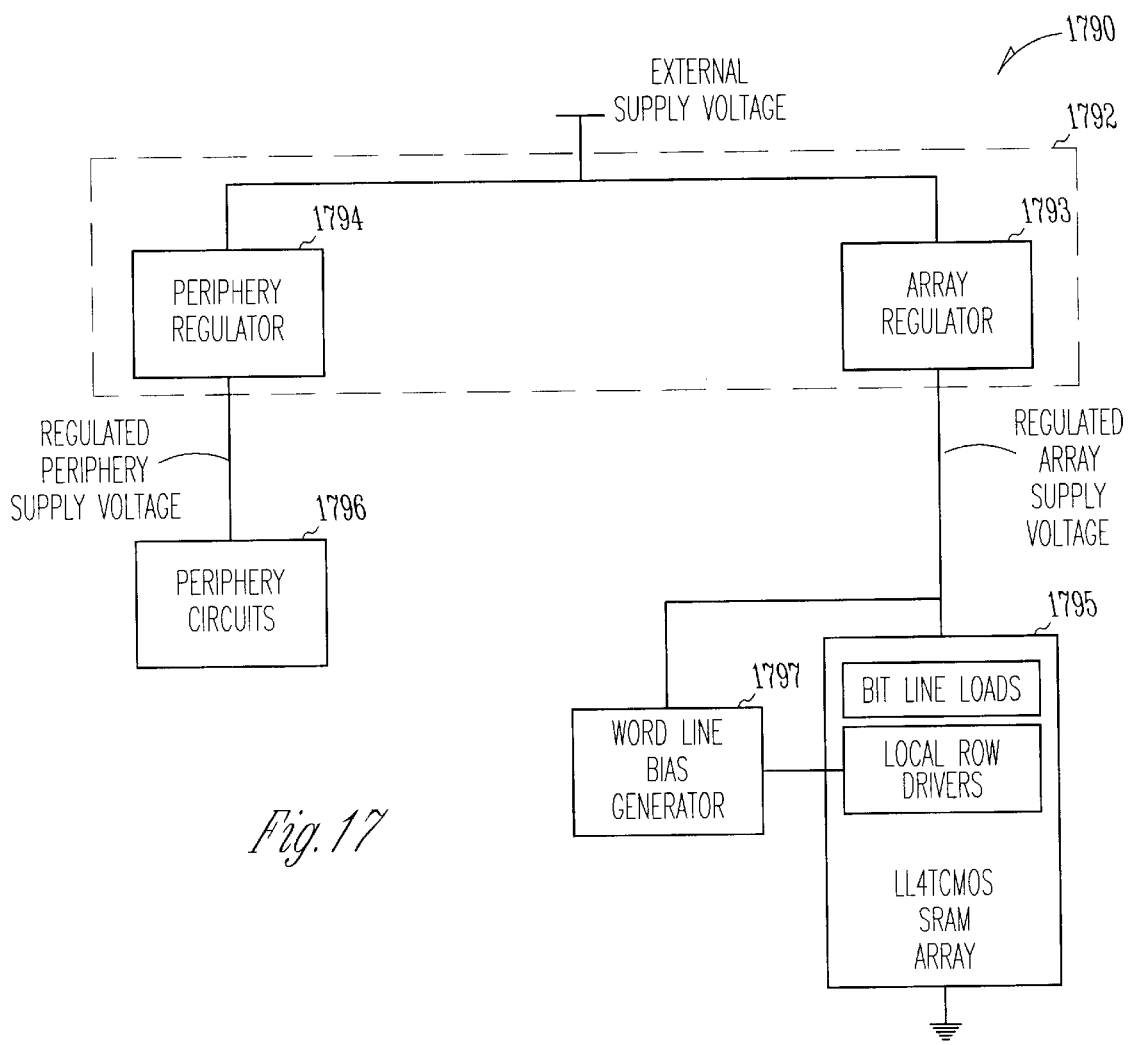
FIG. 17 is a block diagram of a memory circuit.

FIG. 17 is a block diagram of a memory circuit 1790 and illustrates a memory circuit regulation system 1792 according to the teachings of the present invention. The regulation system 1792 comprises an array regulator 1793, and at least one periphery regulator 1794. The array regulator 1793 distributes a regulated array supply voltage to a memory cell array 1795. The at least one periphery regulator will be referred to simply as the periphery regulator throughout the remainder of this specification. In no way shall reference to the periphery regulator be read to limit the scope of the present invention to a single periphery regulator as different regulators may be used for different parts of the periphery circuit. The periphery regulator 1794 distributes a regulated periphery supply voltage to the periphery circuit 1796.

The memory circuit 1790 includes the memory array 1795, the array regulator 1793, the periphery circuit 1796, and the periphery regulator 1794. In one embodiment, the memory cell array 1795 is a LL4TCMOS SRAM cell array that is comprised of a plurality of LL4TCMOS SRAM cells.

A description of a LL4TCMOS SRAM cell 300 was provided above with respect to FIG. 3, and as such will not be repeated here. The LL4TCMOS SRAM cell 300 can be viewed as an analog circuit resulting in a fundamental lower limit of voltage operation for LL4TCMOS SRAM array 1795. That is, the LL4TCMOS SRAM cell 300 needs $V_T$ plus headroom. The devices in the periphery circuit 1796 also have a lower limit of operation. The lower voltage limit for the LL4TCMOS SRAM array 1795 can be higher than the lower limit of voltage operation for the periphery circuit 1796.

In one embodiment of the present invention that includes two separate regulators, the array supply voltage is different than the periphery supply voltage, which allows the regulation system 1792 to be able to provide the appropriate supply voltage to supply the desired stability margins for both the array 1795 and the periphery 1796. The array supply voltage is higher than the periphery supply voltage to incorporate the necessary write noise margin inherent in the design of the transistor circuits for the LL4TCMOS SRAM cell 300 compared to the design of the transistor circuits for the periphery circuits 1796. The array supply voltage provides a stable write noise margin over the array threshold voltage, and the periphery supply voltage provides a stable margin of failure over the periphery threshold voltage. The array regulator 1793 distributes the array supply voltage to bit line loads in the memory array 1795 and to a bias generator 1797 that is coupled to local row drivers in the memory array 1795. In one embodiment, the regulated array supply voltage is within the approximate range of 1.0V to 1.5V and the regulated periphery supply voltage is within the approximate range of 0.7V to 1.2V.

In the quest for smaller and faster integrated circuits, the array supply voltage is scaled down along with dimensions of integrated circuit devices in the memory array 1795 so as not to provide excessive stability margins or write noise margins above the array threshold voltage. Additionally, the periphery supply voltage level is scaled down along with dimensions of integrated circuit devices in the periphery circuit 1796 so as not to provide excessive margins of failure above the periphery threshold voltage. Thus, the memory array 1795 and array regulator 1793 and the periphery circuits 1796 and periphery regulator 1794 are independently scaled to reduce the size, cost, power consumption and performance margins of the integrated circuit.

One embodiment of the memory regulation system includes a SRAM regulation system 1792. The SRAM regulations system 1792 includes an array regulator 1793 and a periphery regulator 1794. The array regulator 1793 distributes an array supply voltage to a SRAM cell array 1795 of LL4TCMOS SRAM cells 300. Each of these cells are connected to a word line and to complementary digit or bit lines. The periphery regulator 1794 distributes a periphery supply voltage to the periphery circuit 1796, which in one embodiment is different or lower than the array supply voltage. The array regulator 1793 sources current through one of the complementary digit lines to offset undesirable leakage currents in each of the plurality of LL4TCMOS SRAM cells 300. In one embodiment, the array regulator sources a temperature-dependent voltage source to compensate for the temperature-dependent subthreshold current in an inactive NMOS pull-down transistor in the memory cell 300. One embodiment of the regulation system 1792 for an LL4TCMOS SRAM array device 1790 provides an array supply voltage approximately within the range of 1.0V to 1.5V and a periphery supply voltage approximately within the range of 0.7V to 1.2V.

Figure 18:
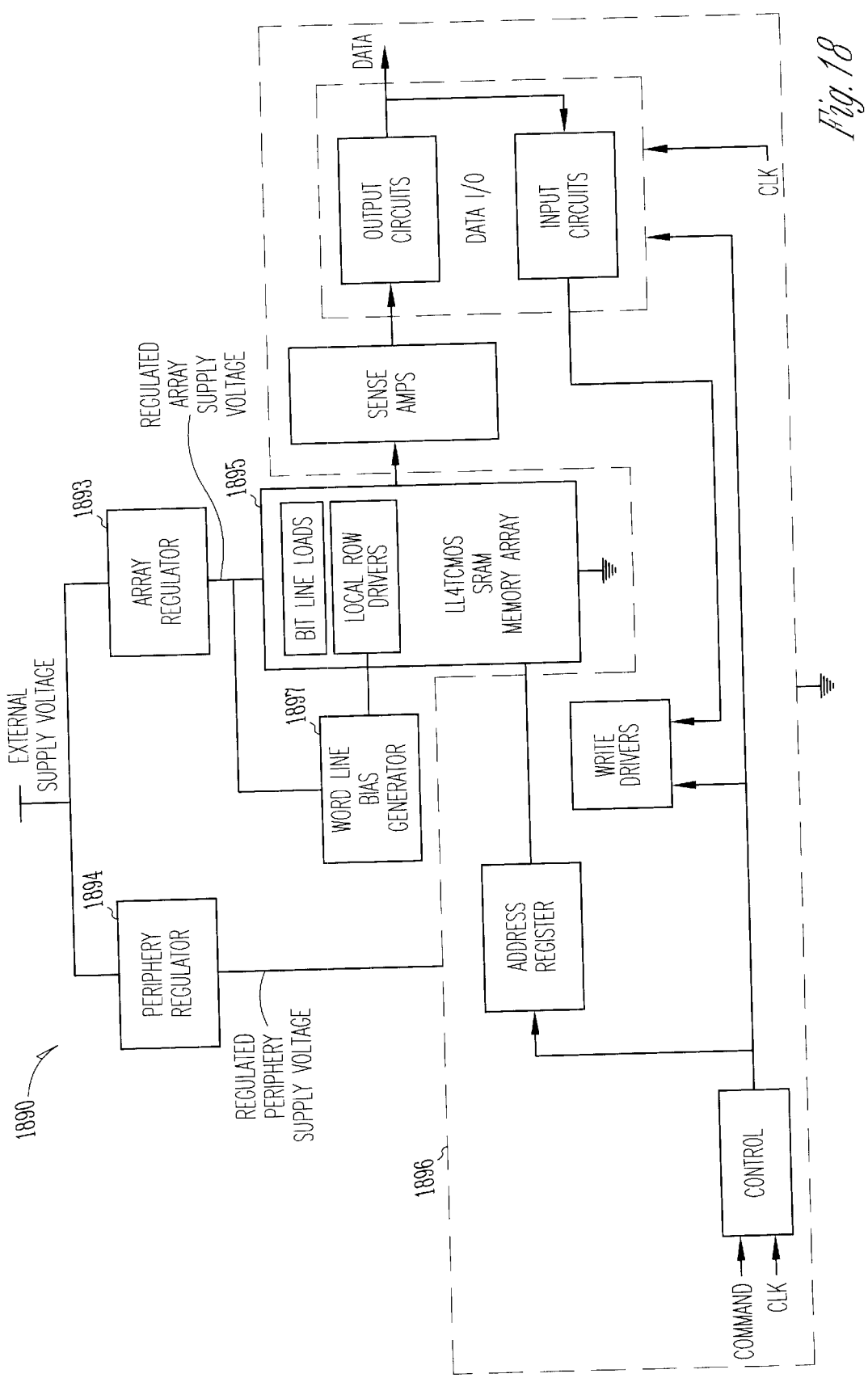
FIG. 18 is another block diagram of a memory circuit.

FIG. 18 is another block diagram of a memory circuit 1890 included herein for the purpose of providing additional detail to the diagram of FIG. 17. In one embodiment of the memory circuit 1890, the array regulator 1893 provides a regulated array supply voltage to a bias generator 1895 or word line bias generator and to bit line loads in the memory array 1895. The bias generator 1897 is coupled to the local row drivers in the memory array 1895. The periphery regulator 1894 provides a regulated periphery supply voltage to the periphery circuits 1896. Additional periphery regulators may be used to provide related voltage to additional peripheral circuits, or to portions of the illustrated peripheral circuit. The illustrated peripheral circuit 1896 includes output circuits, input circuits, sense amplifier circuits, write drivers, address registers and control. These circuits are provided as examples of peripheral circuits. However, the peripheral circuit 1896 may be comprised of portions of the illustrated circuit, additional circuits, and/or different circuits.

Figure 19:
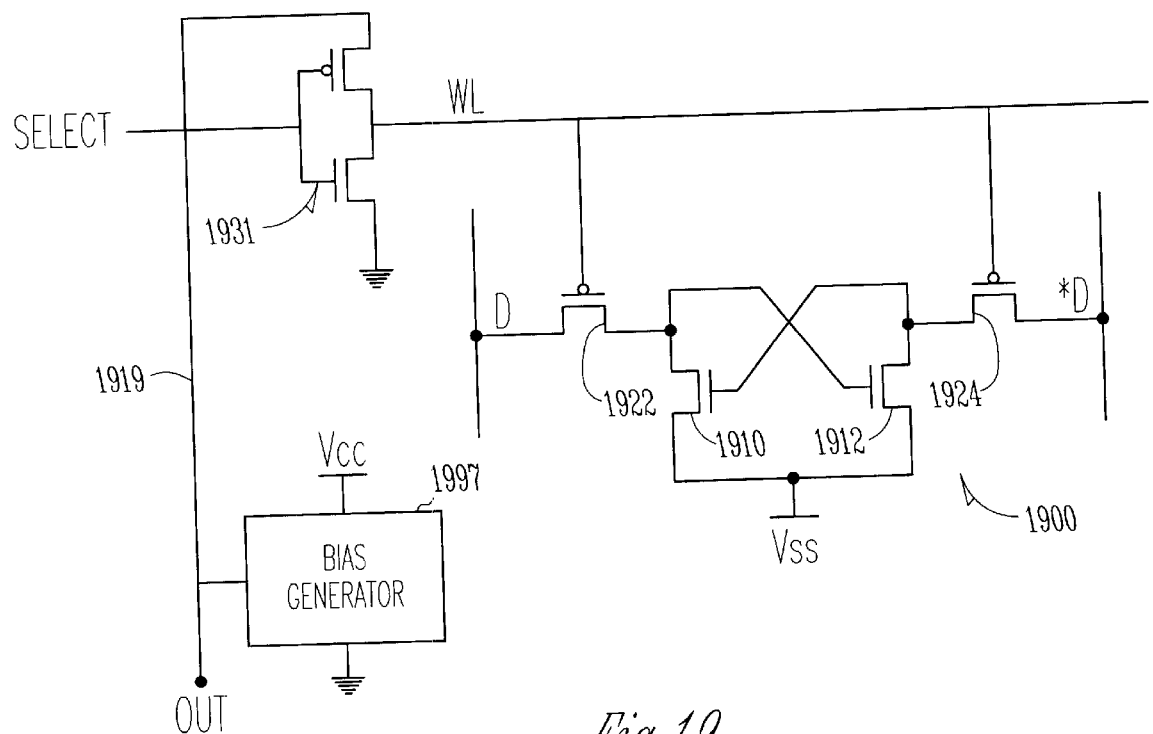
FIG. 19 is a circuit diagram of a LL4TCMOS SRAM cell in conjunction with a bias generator.
Figure 20:
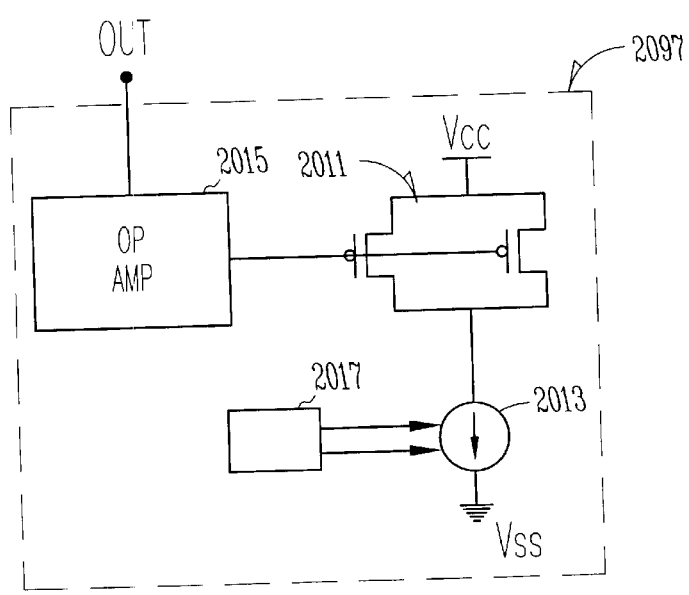
FIG. 20 is a circuit diagram of a temperature-dependent bias generator.

FIG. 19 is a circuit diagram of a LL4TCMOS SRAM cell 1900, which forms part of a larger SRAM array, as shown as 1795 in FIG. 17 or as 1895 in FIG. 18, in conjunction with a bias generator 1997 described above with respect to FIG. 18. FIG. 20 is a circuit diagram of the bias generator shown in FIG. 19. U.S. patent application Ser. No. 09/338,393 filed on Jun. 22, 1999 and entitled BIAS GENERATOR FOR A FOUR TRANSISTOR LOAD LESS MEMORY CELL, assigned to Applicant's assignee, provides a description of a bias generator and is hereby incorporated by reference.

As shown in FIG. 20, the bias generator 2097 includes a bank of PMOS transistors 2011 connected in parallel with each other and connected in series with a temperature-dependent constant current source 2013. The bank of transistors 2011 is fabricated at the same time, and in the same manner, as the PMOS access transistors 1922 and 1924 for the representative SRAM cell shown in FIG. 19. In this manner, the voltage drop from the gate terminal to the source terminal of each of the transistors 2011 should be substantially the same as the gate to source terminal drop of access transistors 1922 and 1924. Thus, the voltage drop across the gate and source terminals of each of the transistors 2011 is representative of the voltage drop across the gate and source terminals of the access transistors 1922 and 1924. The bank of transistors 2011 patterned as array transistors provides good matching characteristics. A single device patterned as an array transistor may be used in place of the bank of transistors 2011 patterned as array transistors. Additionally, a single transistor or a bank of transistors that are not patterned as array transistors may be used in place of the bank of transistors 2011 patterned as array transistors.

Temperature fluctuations will occur. To account for this, a temperature-dependent current source 2013 is provided. The current source 2013 of the bias generator may be constructed using any known techniques which provide a temperature-dependent current source, as the same will be understood by one of ordinary skill in the art upon reading this application. The current source 2013 will produce one value of current, for example, for colder conditions for cold data-retention tests, and another value of current for hotter conditions for burn-in tests. Thus, for each value of current produced by the temperature-dependent constant current source 2013, a different voltage drop across the gate and source terminals of the transistors 2011 is produced. That voltage drop is averaged and sensed by an operational amplifier 2015. Although the bias generator 2097 would operate if only one transistor for the bank of transistors 2011 was provided, a voltage drop which is more representative of the voltage drop experienced in the cells is produced by providing a plurality of transistors within the bank. According to the teachings of the present invention, the voltage sensed by the operational amplifier 2015 is applied to the word line WL which is connected to the gate terminals of the PMOS access transistors 1922 and 1924 in the LL4TCMOS SRAM cell 1900. Thus, when the cell 1900 is in the off-state, i.e. the transistors are nonconductive, the bias voltage applied by the operational amplifier 2015 may be used to control the conduction characteristics of the PMOS access transistors 1922 and 1924 so as to allow the PMOS access transistors 1922 and 1924 to source current from the digit lines to the NMOS pull-down transistors 1910 and 1912 to offset leakage current in the cell 1900. Because the bias voltage is directly related to the current which is produced by the constant current source 2013, and the current is temperature-dependent, the bias voltage is also temperature-dependent. Thus, the conduction characteristics of the PMOS access transistors 1922 and 1924 are controlled according to the temperature such that the current required by the LL4TCMOS SRAM cell 1900 for a given temperature may be properly sourced.

In one embodiment of the invention, the temperature-dependent constant current source 2013 may receive inputs from a programmable device 2017. The programmable device may contain laser trimmable devices, fuses, or antifuses, which allow manipulation of a value adjust signal (VA) and a temperature coefficient adjust (TCA) signal to provide some degree of control over the bias voltage post fabrication.

A plurality of digit lines D and a plurality of word lines WL are used to interconnect individual memory cells 1900 in the array. The bias generator 1997 provides the bias voltage to the array via a global bus 1919. The bias generator is coupled to each of the word lines through a transistor pair 1931 in one embodiment. Each transistor pair 1931 is comprised of a PMOS and an NMOS transistor. The PMOS transistor is connected between the bias generator and a word line. The NMOS transistor is connected between the word line and ground. Each transistor is responsive to a word line select signal.

Figure 21:
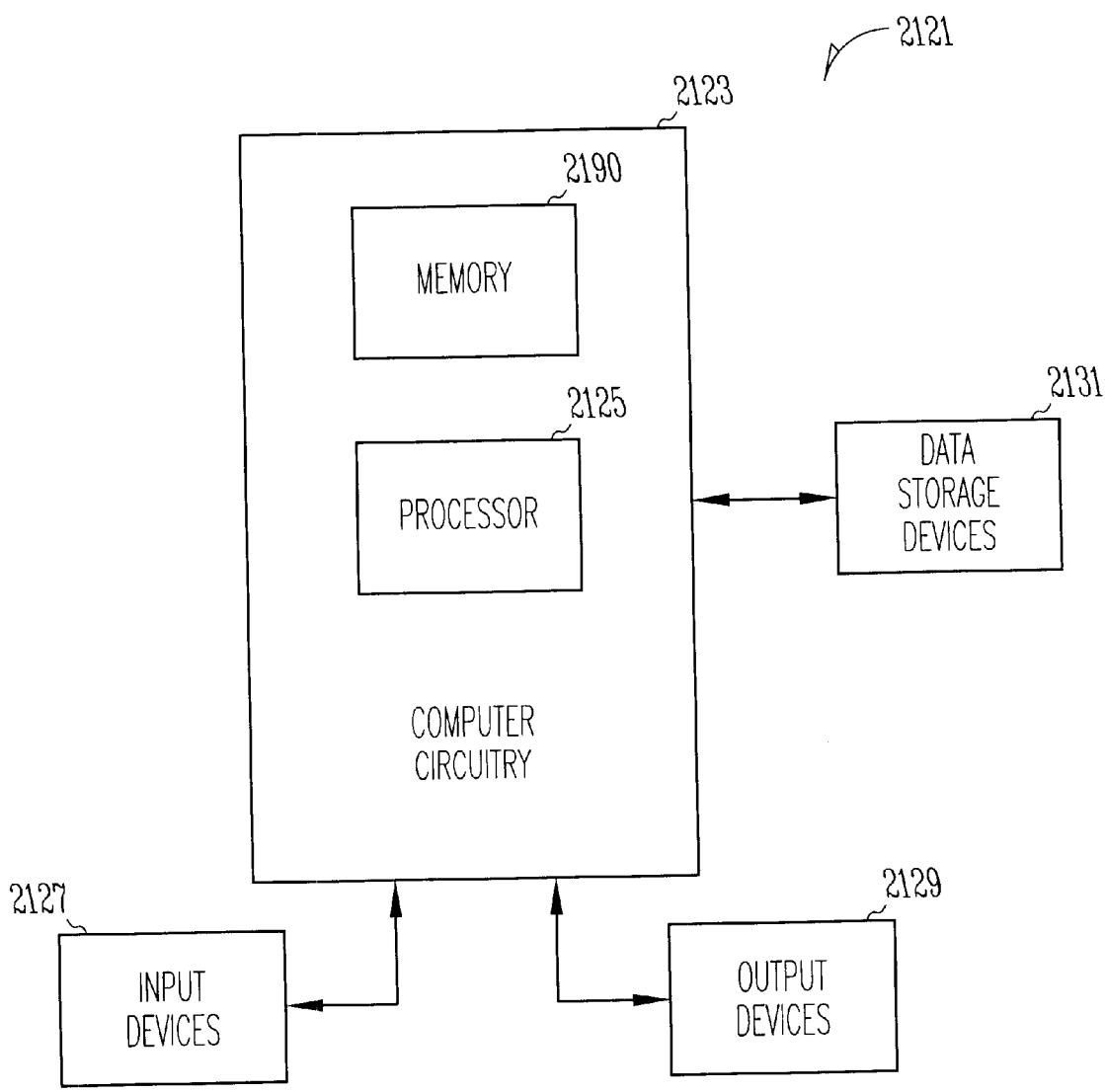
FIG. 21 is a block diagram of a computer system.

FIG. 21 is a block diagram of an electronic system, such as a computer system 2121, that incorporates a memory circuit 2190 formed according to the teachings of the present invention. The system 2121 includes computer circuitry 2123 for performing computer functions, such as executing software to perform desired calculations and tasks. The circuitry 2123 typically includes a processor 2125 and the memory circuit 2190, which is coupled to the processor 2125. One or more input devices 2127, such as a keyboard or a mouse, are coupled to the computer circuitry 2123 and allow data to be input into the system 2121. One or more output devices 2129 are coupled to the computer circuitry 2123 to provide data generated by the computer circuitry. Examples of output devices 2129 include a printer and a video display unit. One or more data storage devices 2131 are coupled to the computer circuitry 2123 to store data on or retrieve data from external storage media. Examples of the storage devices 2131 and the corresponding storage media include drives that accept hard and floppy disks, tape cassettes, and compact disk read-only memories (CD ROMS). Typically the computer circuitry includes address, data, and command buses and a clock line.

The figures presented and described in detail above are similarly useful in describing the method aspects of the present subject matter. The methods described below are nonexclusive as other methods may be understood from the specification and the figures described above.

One aspect provides a method of providing regulated power to a memory circuit, particularly an LL4TCMOS SRAM circuit. The method includes providing a periphery voltage level from a periphery regulator to a periphery circuit, and providing an array voltage level from an array regulator to a memory array. In one embodiment, the periphery voltage level and the array voltage level are different. In another embodiment, the periphery voltage level and the array voltage level are the same. The separate array regulator isolates the periphery circuit from memory array, which is particularly sensitive to noise.

One embodiment of the method further includes providing a periphery regulator, coupling the periphery regulator to a periphery circuit, providing an array regulator, and coupling the array regulator to the memory array. According to one embodiment, coupling the array regulator to the memory array includes providing a word line bias generator, coupling the array regulator to bit line loads in the memory array. The array regulator is coupled to the word line bias generator, and the word line bias generator is coupled to local row drivers in the memory array.

CONCLUSION

The present subject matter provides a system and method for regulating a memory circuit. The memory circuit regulation system comprises an array regulator adapted for distributing an array supply voltage to a memory cell array, and at least one periphery regulator adapted for distributing at least one periphery supply voltage to at least one periphery circuit. The memory array, particularly a LL4TCMOS SRAM array, is particularly susceptible to noise. The separate array regulator isolates the LL4TCMOS SRAM array from the periphery circuit, and thus reduces the effects of noise. Furthermore, LL4TCMOS SRAM cells have a fundamental lower limit of voltage operation that can be higher than the fundamental lower limit of voltage operation for periphery devices. The potential difference in lower voltage limits is due to the required write and read noise margins accounted for in the design of the LL4TCMOS SRAM cell. Rather than requiring all of the circuits to operate from the same regulated voltage, the regulation system provides separate regulated voltages for the memory array and the periphery circuits. Thus, as the memory circuits are scaled smaller to achieve integrated circuits that are less costly and are more power efficient, a designer is not limited to using one large regulated voltage. Rather, the periphery circuit may be scaled down to use a lower regulated voltage than would have been used if only one regulated voltage was used for the entire memory circuit.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A memory circuit regulation system, comprising:
   an array regulator adapted for distributing an array supply voltage to a memory cell array that includes a number of LL4TCMOS SRAM cells with a leakage current;
   a bias generator operably connected to a number of pass transistors to control a subthreshold current from a number of lines to the number of LL4TCMOS SRAM cells, wherein the subthreshold current on the number of lines offsets the leakage current for the number of LL4TCMOS SRAM cells; and
   at least one periphery regulator adapted for distributing at least one periphery supply voltage to at least one periphery circuit.

2. The memory circuit regulation system of claim 1, wherein the array supply voltage is different than the at least one periphery supply voltage.

3. The memory circuit regulation system of claim 2, wherein the at least one periphery supply voltage is lower than the array supply voltage.

4. The memory circuit regulation system of claim 1, wherein the array regulator is adapted for distributing the array supply voltage to bit line loads in the memory array and to the bias generator that is coupled to local row drivers in the memory array.

5. The memory circuit regulation system of claim 4, wherein the array regulator is adapted for distributing the array supply voltage to sense amps.

6. The memory circuit regulation system of claim 4, wherein the array regulator is adapted for distributing the array supply voltage to write drivers.

7. A memory circuit regulation system, comprising:
   an array regulator adapted for distributing an array supply voltage to a memory cell array which is sufficient to maintain a write noise margin in the memory cell array; and
   at least one periphery regulator adapted for distributing at least one periphery supply voltage to at least one periphery circuit which is sufficient to maintain a stable margin of failure for the at least one periphery circuit.

8. The memory circuit regulation system of claim 7, wherein the array supply voltage is within the range of 1.0V to 1.5V and the at least one periphery supply voltage is within the range of 0.7V to 1.2V.

9. A memory circuit regulation system, comprising:
   an array regulator adapted for distributing an array supply voltage to a memory cell array that includes a plurality of transistors arranged in an array transistor circuit design, wherein the array transistor circuit design has an array threshold voltage and the array supply voltage provides a stable margin of failure over the array threshold voltage; and
   at least one periphery regulator adapted for distributing at least one periphery supply voltage to at least one periphery circuit that includes a plurality of transistors arranged in a periphery transistor circuit design, wherein the periphery transistor circuit design has a periphery threshold voltage and the at least one periphery supply voltage provides a stable margin of failure over the periphery threshold voltage.

10. The memory circuit regulation system of claim 9, wherein:
    the array supply voltage is scaled down along with dimensions of integrated circuit devices in the memory array so as not to provide excessive stability margins above the array threshold voltage; and the at least one periphery supply voltage level is scaled down along with dimensions of integrated circuit devices in the at least one periphery circuit so as not to provide excessive margins of failure above the periphery threshold voltage.

11. A SRAM regulation system, comprising:
an array regulator adapted for distributing an array supply voltage to a SRAM cell array that includes a plurality of LL4TCMOS SRAM cells, each of the plurality of LL4TCMOS SRAM cells being connected to a word line and to complementary digit lines;
a bias generator for offsetting parasitic leakage currents in each of the plurality of LL4TCMOS SRAM cells by controlling a subthreshold current from one of the complementary bit lines through a pass transistor; and
at least one periphery regulator adapted for distributing a periphery supply voltage to at least one periphery circuit.

12. The SRAM regulation system of claim 11, wherein the subthreshold current controlled by the bias generator is temperature-dependent.

13. A SRAM regulation system, comprising:
an array regulator adapted for distributing an array supply voltage to a SRAM cell array that includes a plurality of LL4TCMOS SRAM cells, each of the plurality of LL4TCMOS SRAM cells being connected to a word line and to complementary digit lines; and
at least one periphery regulator adapted for distributing a periphery supply voltage to at least one periphery circuit,
wherein the array supply voltage is within the range of 1.0V to 1.5V and the at least one periphery supply voltage is within the range of 0.7V to 1.2V.

14. A LL4TCMOS SRAM regulation system, comprising:
an array regulator adapted for distributing an array supply voltage to a LL4TCMOS SRAM memory cell array that includes a plurality of transistors arranged in an array transistor circuit design, wherein the array transistor circuit design has an array threshold voltage and the array supply voltage provides a stable write noise margin over the array threshold voltage; and
at least one periphery regulator adapted for distributing at least one periphery supply voltage to at least one periphery circuit that includes a plurality of transistors arranged in a periphery transistor circuit design, wherein the periphery transistor circuit design has a periphery threshold voltage and the at least one periphery supply voltage provides a stable margin of failure over the periphery threshold voltage.

15. The LM4TCMOS SRAM regulation system of claim 14, wherein:
the array supply voltage is scaled down along with dimensions of integrated circuit devices in the memory array so as not to provide excessive write noise margins above the array threshold voltage; and
the at least one periphery supply voltage level is scaled down along with dimensions of integrated circuit devices in the at least one periphery circuit so as not to provide excessive margins of failure above the periphery threshold voltage.

16. The LL4TCMOS SRAM regulation system of claim 14, wherein the array supply voltage is within the range of 1.0V to 1.5V and the at least one periphery supply voltage is within the range of 0.7V to 1.2V.

17. A memory device, comprising:
a memory cell array;
at least one periphery circuit coupled to the memory cell array;
an array regulator coupled to the memory cell array and adapted for distributing an array supply voltage to the memory cell array;
at least one periphery regulator coupled to the at least one periphery circuit and adapted for distributing at least one periphery supply voltage to the at least one periphery circuit; and
a bias generator coupled to the array regulator, wherein the array regulator is coupled to bit line loads in the memory array and the bias generator is coupled to local row drivers, and the bias generator is adapted to control current from bit lines to the memory cell array to offset leakage current in the memory cell array.

18. The memory device of claim 17, wherein the memory cell array includes a plurality of LL4TCMOS SRAM cells.

19. The memory device of claim 17, wherein the array supply voltage is different than the at least one periphery supply voltage.

20. The memory device of claim 19, wherein the at least one periphery supply voltage is lower than the array supply voltage.

21. A memory device, comprising:
a memory cell array;
at least one periphery circuit coupled to the memory cell array;
an array regulator coupled to the memory cell array and adapted for distributing an array supply voltage to the memory cell array;
at least one periphery regulator coupled to the at least one periphery circuit and adapted for distributing at least one periphery supply voltage to the at least one periphery circuit;
a bias generator coupled to the array regulator, wherein the array regulator is coupled to bit line loads in the memory array and the bias generator is coupled to local row drivers, wherein the bias generator provides a temperature-dependent bias voltage.

22. A memory device, comprising:
a memory cell array including a plurality of memory cells, wherein each memory cell within the memory cell array has a stable margin of failure;
at least one periphery circuit, wherein the at least one peripheral circuit has a stable margin of failure;
an array regulator coupled to the memory cell array and adapted for distributing an array supply voltage to the memory cell array; and
at least one periphery regulator coupled to the at least one periphery circuit and adapted for distributing at least one periphery supply voltage to the at least one periphery circuit.

23. The memory device of claim 22, wherein:
the stable margin of failure of the memory cell array has a lower limit below which the memory cell array becomes unstable;
the stable margin of failure of the at least one periphery circuit has a lower limit below which the at least one periphery circuit becomes unstable;
the array supply voltage is of a level to maintain the memory cell array above the lower limit of its corresponding stable margin of failure; and
the at least one periphery supply voltage is of a level to maintain the at least one periphery circuit above the lower limit of its corresponding stable margin of failure.

24. A memory device, comprising:
a memory cell array having a lower array operation voltage level for which level the memory cell array maintains a stability margin;
at least one periphery circuit having a lower periphery operation voltage level for which level the at least one periphery circuit maintains a stability margin;
an array regulator coupled to the memory cell array and adapted for distributing an array supply voltage to the memory cell array, wherein the array supply voltage is above the lower array operation voltage level; and
at least one periphery regulator coupled to the at least one periphery circuit and adapted for distributing at least one periphery supply voltage to the at least one periphery circuit, wherein the at least one periphery supply voltage is above the lower periphery operation voltage level.

25. The memory device of claim 24, wherein:
the array supply voltage is scaled down along with dimensions of integrated circuit devices in the memory array so as not to provide excessive stability margins above the lower array operation voltage level; and
the at least one periphery supply voltage level is scaled down along with dimensions of integrated circuit devices in the at least one periphery circuit so as not to provide excessive stability margins above the at least one lower periphery operation voltage level.

26. A memory device, comprising:
a memory cell array including a plurality of transistors arranged in an array transistor circuit, wherein the array transistor circuit has an array threshold voltage;
at least one periphery circuit including a plurality of transistors arranged in a periphery transistor circuit, wherein the periphery transistor circuit has a periphery threshold voltage;
an array regulator coupled to the memory cell array and adapted for distributing an array supply voltage to the memory cell array, wherein the array supply voltage provides a stable margin of failure over the array threshold voltage; and
at least one periphery regulator coupled to the at least one periphery circuit and adapted for distributing at least one periphery supply voltage to the at least one periphery circuit, wherein the at least one periphery supply voltage provides a stable margin of failure over the periphery threshold voltage.

27. The memory device of claim 26, wherein:
the array supply voltage is scaled down along with dimensions of integrated circuit devices in the memory array so as not to provide excessive margin of failure over the array threshold voltage; and
the at least one periphery supply voltage level is scaled down along with dimensions of integrated circuit devices in the at least one periphery circuit so as not to provide excessive margins of failure over the periphery threshold voltage.

28. A SRAM device, comprising:
a SRAM cell array, including a plurality of LL4TCMOS SRAM cells, each of the plurality of LL4TCMOS SRAM cells being connected to a word line and to complementary digit lines;
at least one periphery circuit coupled to the SRAM cell array;
an array regulator coupled to the SRAM cell array and adapted for distributing an array supply voltage to the SRAM cell array through the complementary digit lines;
a bias generator to control a number of pass transistors to source current from a number of the digit lines to offset parasitic leakage currents in the SRAM cell array; and
at least one periphery regulator coupled to the at least one periphery circuit and adapted for distributing at least one periphery supply voltage to the at least one periphery circuit.

29. The SRAM device of claim 28, wherein the array supply voltage is different than the at least one periphery supply voltage.

30. The SRAM device of claim 29, wherein the at least one periphery supply voltage is lower than the array supply voltage.

31. The SRAM device of claim 28, further including a bias generator coupled to the array regulator, wherein the array regulator is coupled to bit line loads in the memory array and wherein the bias generator is coupled to local row drivers.

32. A SRAM device, comprising:
a SRAM cell array, including a plurality of LL4TCMOS SRAM cells, each of the plurality of LL4TCMOS SRAM cells being connected to a word line and to complementary digit lines;
at least one periphery circuit coupled to the SRAM cell array;
an array regulator coupled to the SRAM cell array and adapted for distributing an array supply voltage to the SRAM cell array through the complementary digit lines; and
at least one periphery regulator coupled to the at least one periphery circuit and adapted for distributing at least one periphery supply voltage to the at least one periphery circuit, wherein the array supply voltage is within the range of 1.0V to 1.5V and the at least one periphery supply voltage is within the range of 0.7V to 1.2V.

33. A SRAM device, comprising:
a SRAM cell array, including a plurality of LL4TCMOS SRAM cells, each of the plurality of LL4TCMOS SRAM cells being connected to a word line and to complementary digit lines;
at least one periphery circuit coupled to the SRAM cell array;
an array regulator coupled to the SRAM cell array and adapted for distributing an array supply voltage to the SRAM cell array through the complementary digit lines;
at least one periphery regulator coupled to the at least one periphery circuit and adapted for distributing at least one periphery supply voltage to the at least one periphery circuit; and
a bias generator coupled to the array regulator, wherein the array regulator is coupled to bit line loads in the memory array and wherein the bias generator is coupled to local row drivers, wherein the bias generator provides a temperature-dependent bias voltage.

34. An electronic system, comprising:
a processor; and
a memory device operably coupled to the processor wherein the memory device comprises:
a memory cell array;
at least one periphery circuit coup led to the memory cell array;
an array regulator coupled to the memory cell array and adapted for distributing an array supply voltage to the memory cell array; and at least one periphery regulator coupled to the at least one periphery circuit and adapted for distributing at least one periphery supply voltage to the at least one periphery circuit; and a bias generator coupled to the array regulator, wherein the bias generator is adapted to control current from bit lines to the memory cell array to offset leakage current in the memory cell array.

35. The electronic system of claim 34, further comprising an input device and an output device, wherein both the input device and the output device are operatively coupled to the processor.

36. The electronic system of claim 34, further comprising a data storage device operably coupled to the processor.

37. An electronic system, comprising:

a processor; and a SRAM device operably coupled to the processor wherein the SRAM comprises:

a SRAM cell array, including a plurality of LL4TCMOS SRAM cells, each of the plurality of LL4TCMOS SRAM cells being connected to a word line and to complementary digit lines;

at least one periphery circuit coupled to the SRAM cell array;

an array regulator coupled to the SRAM cell array and adapted for distributing an array supply voltage to the SRAM cell array through the complementary digit lines;

a bias generator to control a number of pass transistors to source current from a number of the digit lines to offset parasitic leakage currents in the SRAM cell array; and at least one periphery regulator coupled to the at least one periphery circuit and adapted for distributing a periphery supply voltage to the at least one periphery circuit.

38. The electronic system of claim 37, wherein the at least one periphery supply voltage is lower than the array supply voltage.

39. An electronic system, comprising:

a processor; and a SRAM device operably coupled to the processor wherein the SRAM comprises:

a SRAM cell array, including a plurality of LL4TCMOS SRAM cells, each of the plurality of LL4TCMOS SRAM cells being connected to a word line and to complementary digit lines;

at least one periphery circuit coupled to the SRAM cell array;

an array regulator coupled to the SRAM cell array and adapted for distributing an array supply voltage to the SRAM cell array through the complementary digit lines; and at least one periphery regulator coupled to the at least one periphery circuit and adapted for distributing a periphery supply voltage to the at least one periphery circuit, wherein the array supply voltage is within the range of 1.0V to 1.5V and the at least one periphery supply voltage is within the range of 0.7V and 1.2V.

40. An electronic system, comprising:

a processor; and a SRAM device operably coupled to the processor wherein the SRAM comprises:

a SRAM cell array, including a plurality of LL4TCMOS SRAM cells, each of the plurality of LL4TCMOS SRAM cells being connected to a word line and to complementary digit lines;

at least one periphery circuit coupled to the SRAM cell array;

an array regulator coupled to the SRAM cell array and adapted for distributing an array supply voltage to the SRAM cell array through the complementary digit lines;

at least one periphery regulator coupled to the at least one periphery circuit and adapted for distributing a periphery supply voltage to the at least one periphery circuit; and a bias generator coupled to the array regulator, wherein the bias generator provides a temperature dependent bias voltage.

41. A method of providing regulated power to a memory circuit, comprising:

providing at least one periphery voltage level from at least one periphery regulator to at least one periphery circuit;

providing an array voltage level from an array regulator to a memory array; and providing a subthreshold bit line current to offset leakage current in the memory array.

42. The method of claim 41, wherein providing the at least one periphery voltage level and providing the array voltage level includes providing at least one periphery voltage level and the array voltage level that are different.

43. The method of claim 41, wherein providing the at least one periphery voltage level and providing the array voltage level includes providing at least one periphery voltage level and the array voltage level that are the same.

44. The method of claim 41, further including:

providing at least one periphery regulator;

coupling the at least one periphery regulator to at least one periphery circuit;

providing an array regulator; and coupling the array regulator to the memory array.

45. The method of claim 44, wherein coupling the array regulator to the memory array comprises:

providing a word line bias generator;

coupling the array regulator to bit line loads in the memory array;

coupling the array regulator to the word line bias generator; and coupling the word line bias generator to local row drivers in the memory array such that the word line bias generator controls a gate voltage for a number of pass transistors to provide the subthreshold bit line current.

46. The method of claim 41, wherein providing an array voltage level includes providing an array voltage level from the array regulator to an LL4TCMOS SRAM array.

47. A method of providing regulated power to a memory circuit, comprising:

providing at least one periphery voltage level from at least one periphery regulator to at least one periphery circuit; and providing an array voltage level from an array regulator to a memory array, wherein providing an array voltage level comprises generating a temperature-dependent voltage level to source current to offset temperature-dependent parasitic leakage currents in the plurality of LL4TCMOS SRAM cells.

48. A method of providing regulated power to a SRAM circuit, comprising:

providing at least one periphery voltage level within the range of 0.7V to 1.2V from at least one periphery regulator to at least one periphery circuit; and providing an array voltage level within the range of 1.0V to 1.5V from an array regulator to a SRAM array, including a plurality of LL4TCMOS SRAM cells.

49. The method of claim 48, further including providing a temperature-dependent bias current to offset temperature dependent subthreshold leakage current in the plurality of LL4TCMOS SRAM cells.

50. A method of forming a memory circuit regulation system, comprising:

providing at least one periphery regulator;

coupling the at least one periphery regulator to at least one periphery circuit;

providing at least one array regulator;

providing a word line bias generator;

coupling the array regulator to bit line loads in the memory array;

coupling the array regulator to the word line bias generator; and coupling the word line bias generator to local row drivers in the memory array such that the word line bias generator controls a gate voltage for a number of pass transistors to provide a subthreshold bit line current to offset leakage current in the memory array.

51. A method of forming a memory device, comprising:

providing at least one periphery regulator;

providing at least one periphery circuit;

coupling the at least one periphery regulator to at least one periphery circuit;

providing an array regulator;

providing a memory array;

coupling the array regulator to a memory array;

providing a word line bias generator;

coupling the array regulator to bit line loads in the memory array;

coupling the array regulator to the word line bias generator; and coupling the word line bias generator to local row drivers in the memory array such that the word line bias generator controls a gate voltage for a number of pass transistors to provide a subthreshold bit line current to offset leakage current in the memory array.

52. The method of claim 51, wherein providing a memory array includes providing an LL4TCMOS SRAM array.

* * * * *

UNITED STATES PATENT AND TRADEMARK OFFICE
CERTIFICATE OF CORRECTION

PATENT NO. : 6,584,030 B2
DATED : June 24, 2003
INVENTOR(S) : Kenneth W. Marr

It is certified that error appears in the above-identified patent and that said Letters Patent is hereby corrected as shown below:

Title page,
Item [56], U.S. PATENT DOCUMENTS, "Hung et al." reference, delete "4/2000" and insert -- 4/2002 -- therefor.
"Narendra et al." reference, delete "4/2002" and insert -- 4/2000 -- therefor.

Column 4,
Line 50, delete "1 14" and insert -- 114 -- therefor.

Column 8,
Line 49, delete "(1.3 mV per ºC.)" and insert -- (≈1.3 mV per ºC.) --
Line 52, delete "I," and insert -- $I_1$ -- therefor.

Column 15,
Line 53, delete "LM4TCMOS" and insert -- LL4TCMOS -- therefor.

Column 18,
Line 63, delete "coup led" and insert -- coupled -- therefor.

Signed and Sealed this

Twenty-third Day of December, 2003

JAMES E. ROGAN
*Director of the United States Patent and Trademark Office*